United States Patent [19]

Gillery et al.

[11] Patent Number: 4,600,490

[45] Date of Patent: Jul. 15, 1986

[54] ANODE FOR MAGNETIC SPUTTERING

[75] Inventors: F. Howard Gillery, Allison Park; Russell C. Criss, Pittsburgh, both of Pa.

[73] Assignee: PPG Industries, Inc., Pittsburgh, Pa.

[21] Appl. No.: 663,913

[22] Filed: Oct. 23, 1984

Related U.S. Application Data

[63] Continuation-in-part of Ser. No. 571,406, Jan. 17, 1984, Pat. No. 4,478,702.

[51] Int. Cl.$^4$ .............................................. C23C 14/00
[52] U.S. Cl. .................................................... 204/298
[58] Field of Search ........................................ 204/298

[56] References Cited

U.S. PATENT DOCUMENTS

| | | | |
|---|---|---|---|
| 4,166,018 | 8/1979 | Chapin | 204/192 R |
| 4,426,274 | 1/1984 | Ephrath | 204/298 |
| 4,426,275 | 1/1984 | Meckel | 204/298 |

*Primary Examiner*—R. L. Andrews
*Attorney, Agent, or Firm*—Donna L. Seidel

[57] ABSTRACT

An improved anode system for producing coatings by magnetic sputtering is disclosed, comprising an anode structure of expanded metal.

5 Claims, 1 Drawing Figure

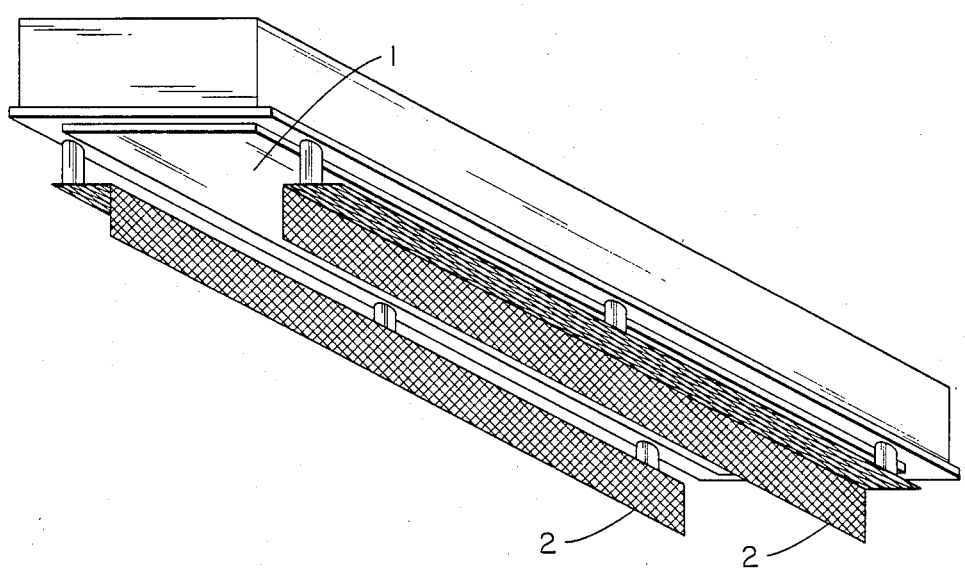

ANODE FOR MAGNETIC SPUTTERING

CROSS-REFERENCE

This application is a continuation-in-part of U.S. Ser. No. 571,406 filed Jan. 17, 1984 by the same inventors, entitled "Anode For Magnetic Sputtering Apparatus", now U.S. Pat. No. 4,478,702.

BACKGROUND OF THE INVENTION

This invention relates generally to the art of magnetic sputtering, and more particularly to the art of anode designs for magnetic sputtering.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface. Chapin teaches that the configuration of the anode is relatively unimportant, but it is preferred that the anode be of relatively small size compared to the cathode surface. In the illustrated embodiment, the anode comprises a bar of relatively small cross-section which extends around the cathode spaced from its perimeter.

In prior art literature on magnetic sputtering, the design of the anode system is typically either ignored or dismissed as relatively unimportant. However, it is disclosed in U.S. Pat. No. 4,478,702 to Gillery et al that appropriate anode design is essential to attaining very uniform sputtered films, particularly in reactive sputtering processes, and most especially when depositing insulating layers, such as titanium oxide.

SUMMARY OF THE INVENTION

The present invention involves an improved anode system utilizing a metal mesh rather than a metal plate as the anode. Because the mesh design allows free flow of the reactive atmosphere in the sputtering chamber, the mesh anode may be oriented vertically instead of horizontally. The anode system of the present invention is particularly well designed for use with an elongated rectangular cathode of the type typically used in a scanning magnetron sputtering coating apparatus. The anode system of the present invention may comprise a single anode, but generally comprises two separate anode mesh structures disposed on opposite sides of the cathode or on opposite sides of the substrate. The configuration, dimensions and placement of the anodes are very important. For a uniform thickness coating, each anode should be at least substantially the same length as the parallel dimension of the substrate to be coated, typically about the same length as the cathode. For a gradient thickness coating, the length and width of the anode is determined by the pattern of coating desired. The thickness of the anode is preferably minimal. An expanded metal mesh of the desired configuration provides a particularly suitable anode structure.

In a preferred embodiment of the present invention, an expanded metal mesh anode system is positioned along the cathode oriented with the effective surface of the anode perpendicular to the sputtering surface of the cathode and the surface of the substrate to be coated. In addition to permitting vertical orientation of the anode, the metal mesh anode design of the present invention reduces or eliminates the need for cooling of the anode.

BRIEF DESCRIPTION OF THE DRAWING

FIG. 1 illustrates an elongated rectangular cathode 1 with a pair of elongated mesh anodes 2 positioned on opposite sides of the cathode 1, and oriented with the effective surfaces of the anodes perpendicular to the sputtering surface of the cathode 1.

DETAILED DESCRIPTION OF THE PREFERRED EMBODIMENTS

In a typical commercially available magnetic sputtering coating apparatus, the anode supplied consists of an elongated loop of copper tubing disposed on one side of an elongated rectangular cathode. In operation, this system deposits a coating of extremely poor uniformity. For example, when sputtering a titanium oxide film from a titanium metal cathode 40 inches (1 meter) long and 6 inches (15 centimeters) wide scanning over a distance of 24 inches (61 centimeters) at a distance of 3 inches (7.6 centimeters) from the substrate in an atmosphere of 13 percent oxygen in argon at an average current density of 0.0625 amps per square inch (0.0097 amps per square centimeter), the thickness of the coating varies by 30 percent. Typically, a thick band of coating is formed along one edge of the substrate and bands of varying thickness are formed in the center.

In the development of the present invention, it was deduced from a series of experiments that as electrons leave the face of the cathode and travel in the magnetic tunnel created by the magnetic field developed by the sputtering apparatus, they begin to lose energy and are attracted to the anode. As a result, it was discovered, the shape of the anode and its proximity to the magnetic tunnel tend to affect the current flow along the cathode, thereby determine the rate of deposition of the coating, and ultimately control the film thickness.

Metal mesh anode designs of the present invention oriented vertically in relation to a horizontal cathode provide uniform current flow along the cathode, which promotes a uniform deposition rate, which results in a uniform film. Symmetrical metal mesh anode designs for depositing uniform films in accordance with the present invention comprise a pair of anodes disposed on opposite sides of a cathode, wherein the major dimension (length) of the anodes is substantially equal to the major dimension (length) of the cathode, and the spacing between the cathode and each anode is uniform along its length. The effective surfaces of the anodes are perpendicular with the sputtering surface of the cathode.

In one preferred embodiment of the present invention, a pair of elongated rectangular anodes 2 is disposed on opposite sides of an elongated rectangular cathode 1 as in FIG. 1. The anodes typically comprise an expanded mesh of mild steel, which withstands the heat build-up incidental to cathode sputtering without requiring cooling. Metal mesh anode designs of the present invention may also be shaped to provide for the deposition of a desired gradient film.

Although the present invention has been discussed in detail above with respect to a titanium cathode, steel mesh anodes and a scanning apparatus, various other target materials, such as indium, may be used, as well as other expanded metals and configurations for the anode. Either scanning or stationary cathodes may be used to produce either uniform or gradient coatings. The present invention will be further understood from the description of the specific example which follows.

EXAMPLE I

A stationary titanium cathode with a sputtering surface measuring 6 by 40 inches (15 by 102 centimeters) is spaced about 3 inches (about 7.6 centimeters) from a glass substrate having approximately the same dimensions. A pair of mild steel expanded mesh anodes shaped and positioned as illustrated in FIG. 1 is used in this example. The cathode is sputtered at an average current density of 0.0625 amps per square inch (0.0097 amps per square centimeter) for about 5 minutes in an atmosphere of 13 percent oxygen in argon at a pressure of $6 \times 10^{-4}$ Torr to produce a uniform titanium oxide film on the glass surface.

The above example is offered only to illustrate the present invention. Other anode shapes, sizes and positions may be employed to form coatings. While the example above employs a stationary cathode, a scanning cathode or moving substrate may be employed. The cathode, anode and substrate may be comprised of a variety of materials known in the art. The scope of the invention is defined by the following claims.

We claim:

1. In an apparatus for coating a substrate comprising a cathode having a substantially planar surface consisting of a material to be sputtered, magnet means for producing a magnetic field having lines of flux which extend in a curve from said sputtering surface and return thereto to form a magnetic tunnel over a closed loop erosion region on said sputtering surface, an anode positioned to produce an accelerating electric field adjacent said sputtering surface for producing a glow discharge confined by said magnetic field to the region adjacent said sputtering surface and within said magnetic tunnel, and means for connecting said cathode and said anode to a source of electrical potential, the improvement which comprises said anode comprising a metal mesh structure.

2. The improved apparatus according to claim 1, wherein the cathode is of elongated rectangular shape, and the anode comprises a pair of metal mesh anode structures positioned on opposite sides of the cathode.

3. The improved apparatus according to claim 2, wherein each anode structure is of elongated shape substantially the same length as the parallel dimension of the substrate surface to be coated.

4. The improved apparatus according to claim 3, wherein the effective surfaces of the metal mesh anode structures are substantially perpendicular to the sputtering surface of the cathode.

5. In an apparatus according to claim 1, the improvement which comprises said anode comprising a metal mesh structure asymmetrically designed to produce a gradient sputtered coating.

* * * * *